(12) United States Patent
Frank et al.

(10) Patent No.: US 9,287,358 B2
(45) Date of Patent: Mar. 15, 2016

(54) STRESSED NANOWIRE STACK FOR FIELD EFFECT TRANSISTOR

(71) Applicant: International Business Machines Corporation, Armonk, NY (US)

(72) Inventors: Martin M. Frank, Dobbs Ferry, NY (US); Pouya Hashemi, White Plains, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/221,349

(22) Filed: Mar. 21, 2014

(65) Prior Publication Data

US 2015/0270340 A1    Sep. 24, 2015

(51) Int. Cl.
*H01L 29/06* (2006.01)
*H01L 29/423* (2006.01)
(Continued)

(52) U.S. Cl.
CPC ............. *H01L 29/0673* (2013.01); *B82Y 10/00* (2013.01); *H01L 21/31105* (2013.01);
(Continued)

(58) Field of Classification Search
CPC ............... H01L 21/823431; H01L 21/823828; H01L 21/845; H01L 27/0924; H01L 27/10879; H01L 29/413; H01L 29/0673; H01L 29/42376; H01L 29/4238; H01L 29/7842; H01L 29/0669
USPC .................................. 977/762, 765, 936, 938
See application file for complete search history.

(56) References Cited

U.S. PATENT DOCUMENTS

| 6,297,063 B1 | 10/2001 | Brown et al. |
| 8,063,450 B2 | 11/2011 | Wernersson et al. |

(Continued)

FOREIGN PATENT DOCUMENTS

| WO | 2013085534 A1 | 6/2013 |
| WO | 2013095652 A1 | 6/2013 |

OTHER PUBLICATIONS

D. Sacchetto et al, "Fabrication and Characterizaton of Vertically Stacked Gate-All-Around Si Nanowire FET Arrays", Proceedings of the European Solid State Device Research Conference, Sep. 14-18, 2009, IEEE, pp. 245-248.*

(Continued)

*Primary Examiner* — Daniel Whalen
*Assistant Examiner* — Suberr Chi
(74) *Attorney, Agent, or Firm* — Scully, Scott, Murphy & Presser, P.C.; Louis J. Percello, Esq.

(57) ABSTRACT

A disposable gate structure is formed over the alternating stack of first semiconductor material portions and second semiconductor material portions. The second semiconductor material portions are removed selective to the first semiconductor material portions to form suspended semiconductor nanowires. Isolated gate structures are formed in regions underlying the disposable gate structure by deposition and recessing of a first gate dielectric layer and a first gate conductor layer. After formation of a gate spacer, source regions, and drain regions, raised source and drain regions are formed on the source regions and the drain regions by selective deposition of a semiconductor material. The disposable gate structure is replaced with a replacement gate structure by deposition and patterning of a second gate dielectric layer and a second gate conductor layer. Distortion of the suspended semiconductor nanowires is prevented by the disposable gate structure and the isolated gate structures.

14 Claims, 14 Drawing Sheets

(51) Int. Cl.
*H01L 29/78* (2006.01)
*H01L 27/12* (2006.01)
*H01L 29/49* (2006.01)
*H01L 29/66* (2006.01)
*H01L 21/84* (2006.01)
*H01L 21/3213* (2006.01)
*H01L 21/311* (2006.01)
*B82Y 10/00* (2011.01)
*H01L 29/40* (2006.01)
*H01L 29/775* (2006.01)

(52) U.S. Cl.
CPC .......... *H01L21/32133* (2013.01); *H01L 21/84* (2013.01); *H01L 27/1203* (2013.01); *H01L 29/401* (2013.01); *H01L 29/4232* (2013.01); *H01L 29/4238* (2013.01); *H01L 29/42356* (2013.01); *H01L 29/42364* (2013.01); *H01L 29/49* (2013.01); *H01L 29/66545* (2013.01); *H01L 29/775* (2013.01); *H01L 29/7842* (2013.01)

(56) References Cited

U.S. PATENT DOCUMENTS

| | | | |
|---|---|---|---|
| 8,367,492 B2 | 2/2013 | Chidambarrao et al. | |
| 8,368,125 B2 | 2/2013 | Chidambarrao et al. | |
| 2009/0085119 A1* | 4/2009 | Ernst et al. | 257/365 |
| 2009/0127584 A1* | 5/2009 | Morand et al. | 257/192 |
| 2010/0270619 A1* | 10/2010 | Lee | 257/365 |
| 2011/0012176 A1 | 1/2011 | Chidambarrao et al. | |
| 2012/0199812 A1 | 8/2012 | Baykan et al. | |
| 2013/0161756 A1 | 6/2013 | Glass et al. | |

OTHER PUBLICATIONS

C. Dupre et al, 15nm diameter 3D Stacked Nanowires with Independent Gates Operation: fFET, IEEE International Electron Devices Meeting (IEDM) Technical Digest, Dec. 15-17, 2008, pp. 1-4.*

Selvaraj, S.K. et al., "Selective atomic layer deposition of zirconia on copper patterned silicon substrates using ethanol as oxygen source as well as copper reductant" Journal of Vacuum Science & Technology A (Jan./Feb. 2014) pp. 010601-01-010601-4, vol. 32, No. 1.

Frank, M.M. et al., "Hydrogen Barrier Layer Against Silicon Oxidation during Atomic Layer Deposition of Al2O3 and HfO2" Journal of the Electrochemical Society (Jan. 2, 2007) pp. G44-G48, vol. 154, No. 2.

Tao, Q. et al., "On the Initial Growth of Atomic Layer Deposited TiO2 films on Silicon and Copper Surfaces" Thin Solid Films (Sep. 1, 2012) pp. 6752-6756, vol. 520, No. 22.

Green, M.L. et al., "Nucleation and growth of atomic layer deposited HfO2 gate dielectric layers on chemical oxide (Si—O—H) and thermal oxide (SiO2 or Si—O—N) underlayers" Journal of Applied Physics (Dec. 15, 2002) pp. 7168-7174, vol. 92, No. 12.

Frank, M.M. et al., "Enhanced initial growth of atomic-layer-deposited metal oxides on hydrogen-terminated silicon" Applied Physics Letters (Jul. 28, 2003) pp. 740-742, vol. 83, No. 4.

* cited by examiner

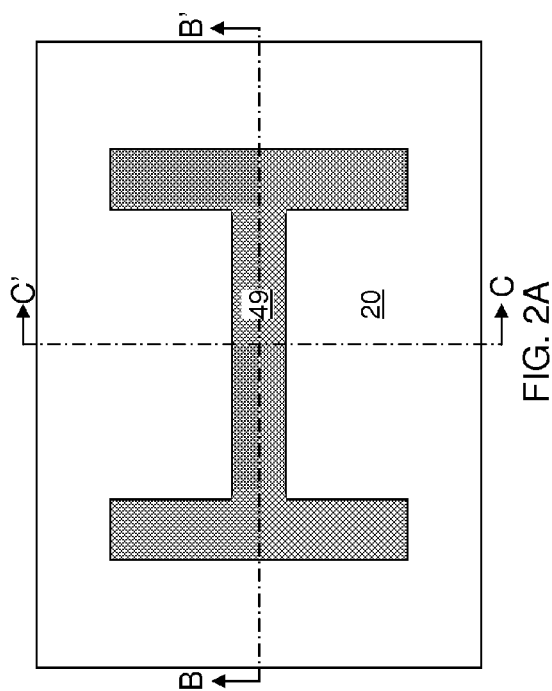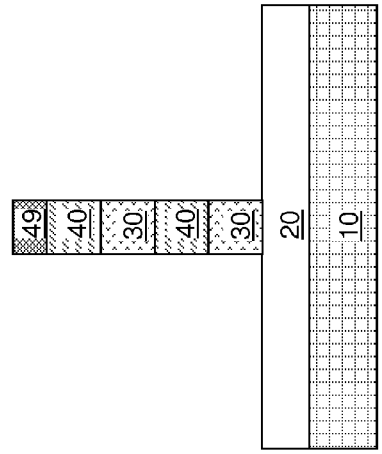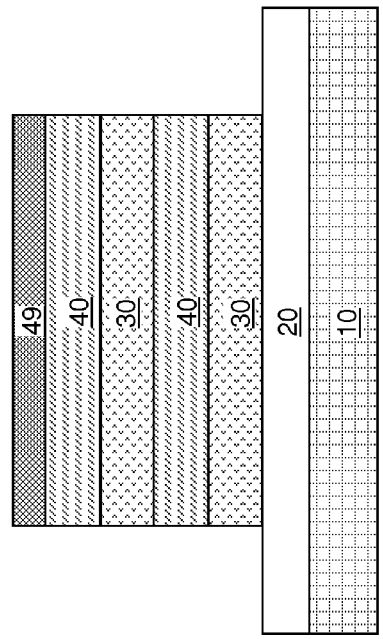

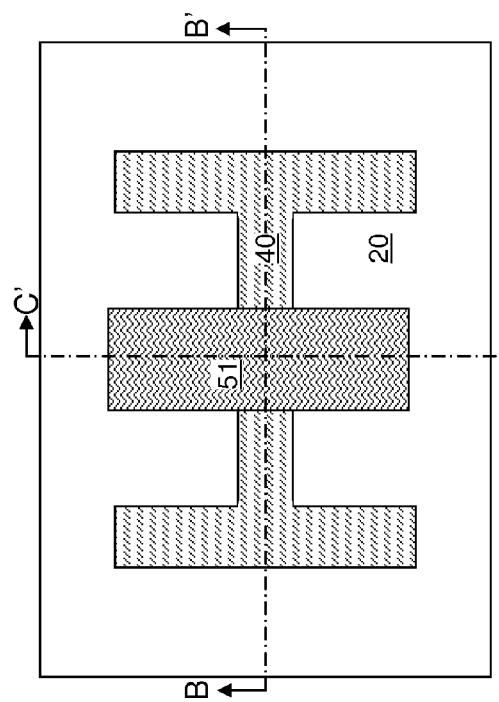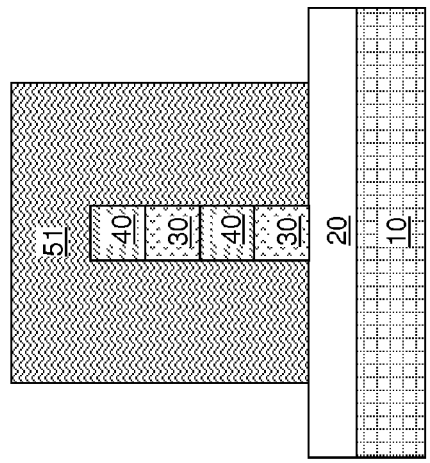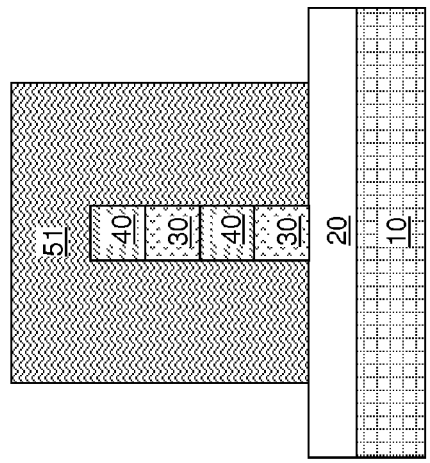

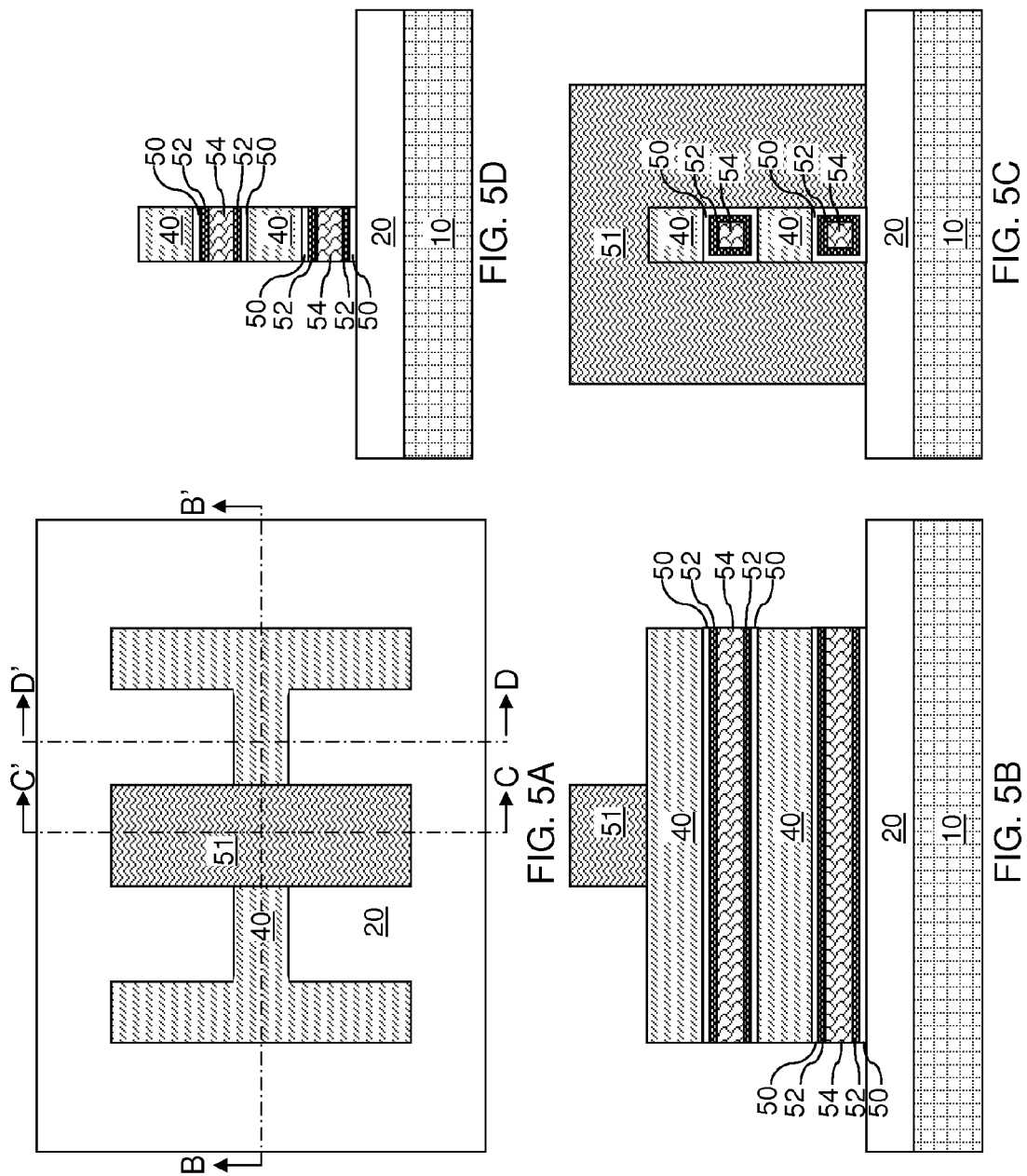

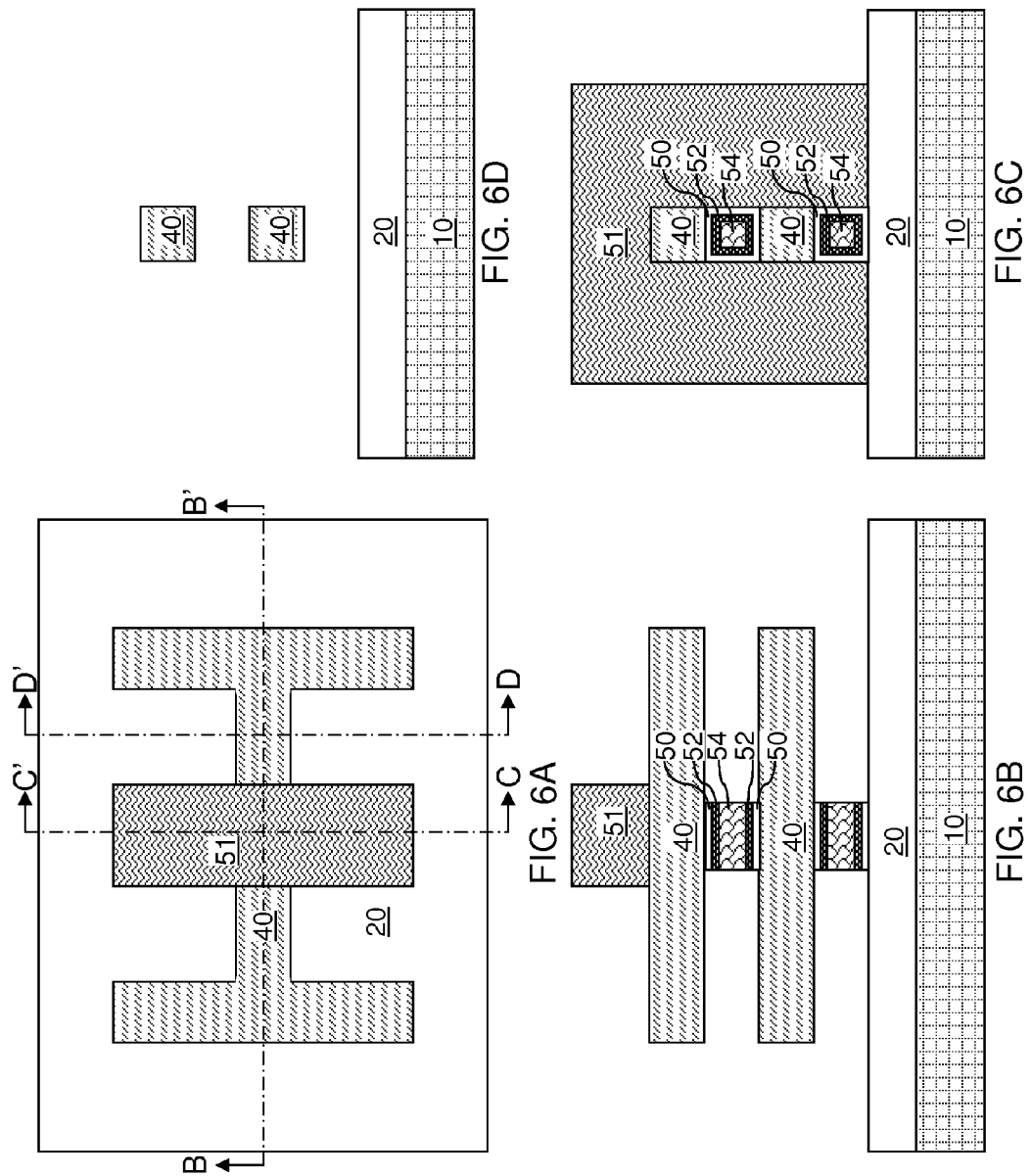

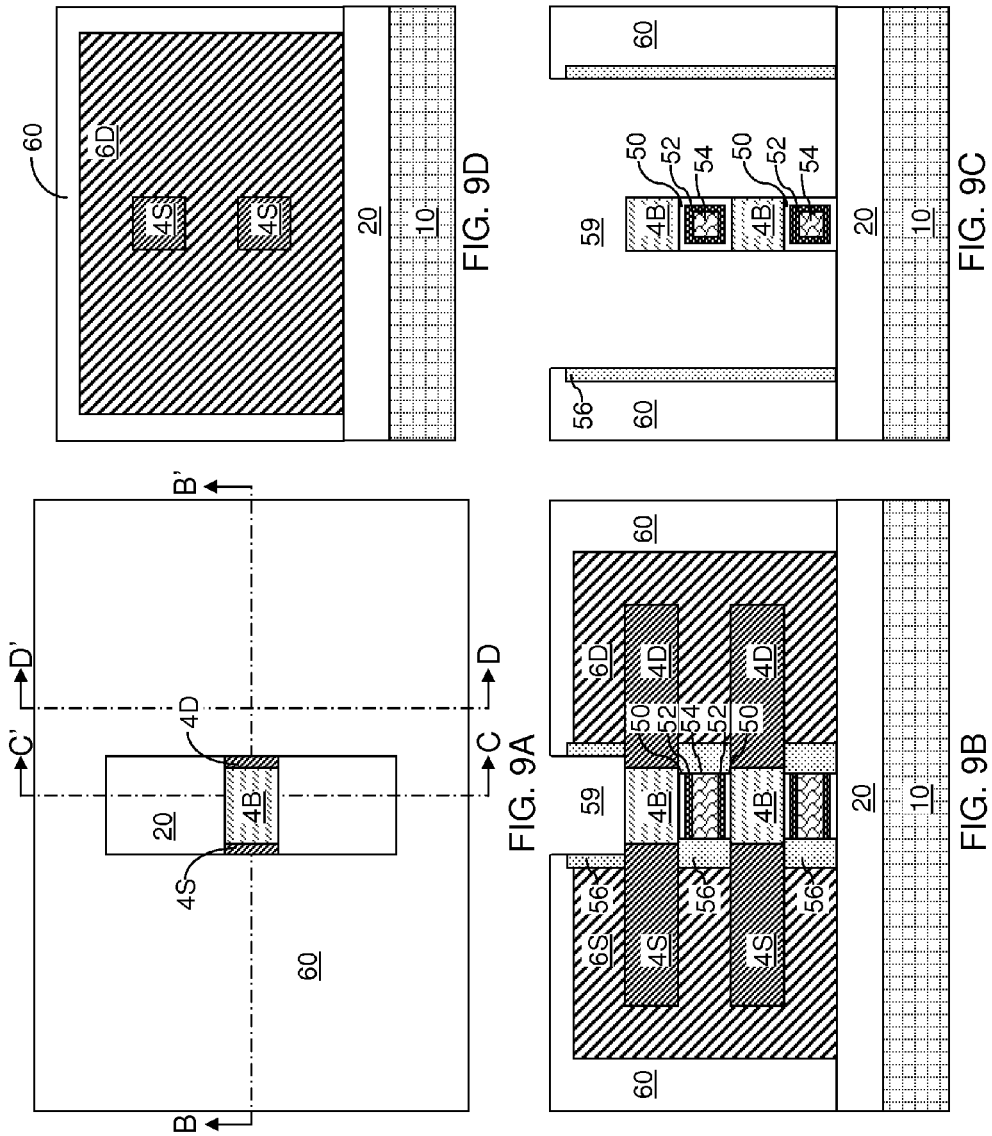

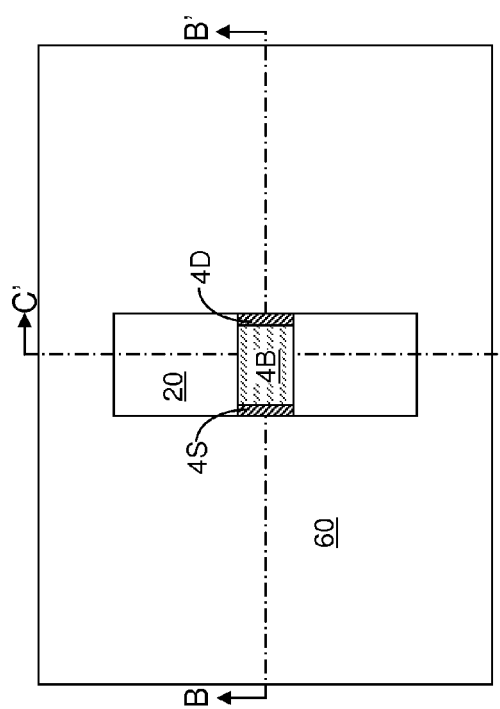
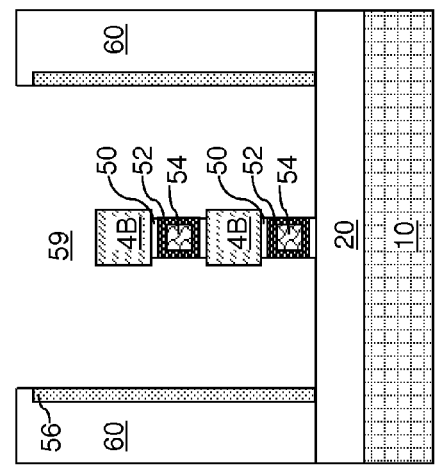
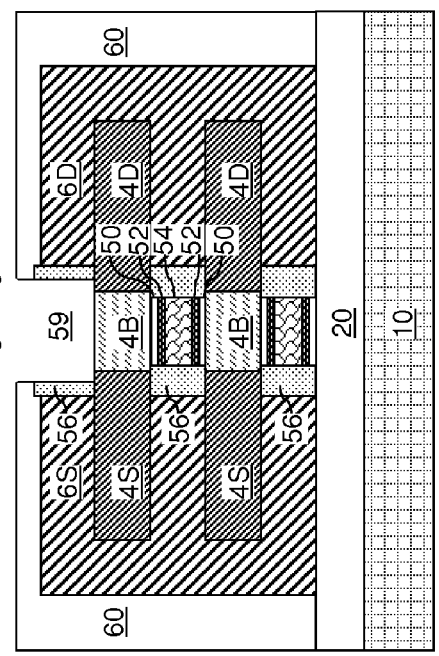
FIG. 10A
FIG. 10B
FIG. 10C

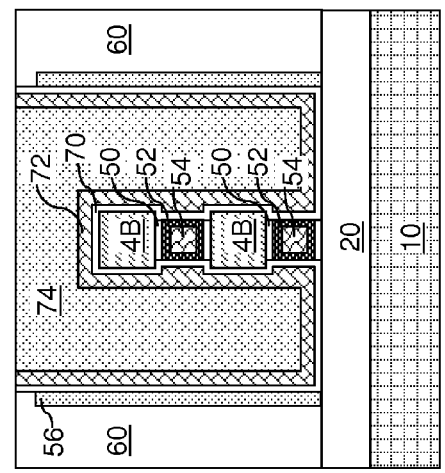
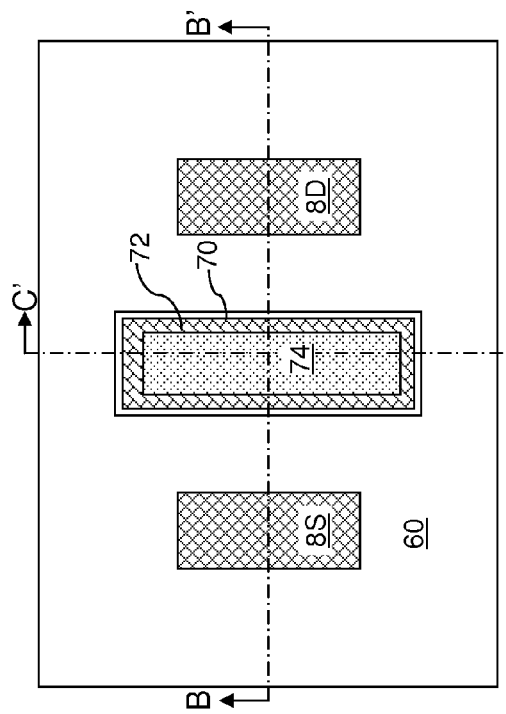
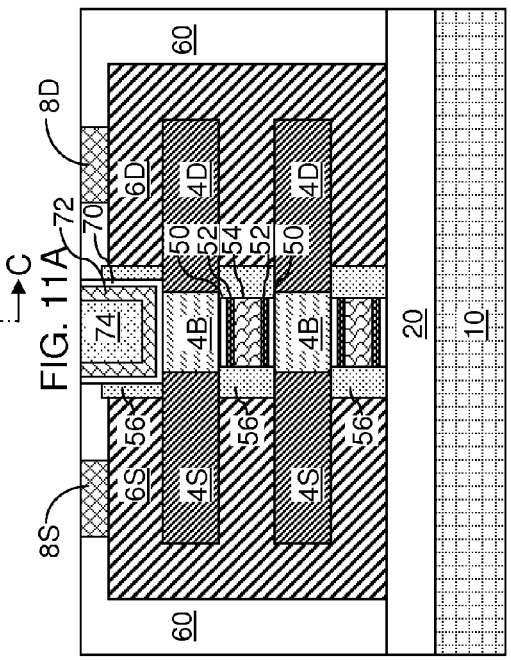

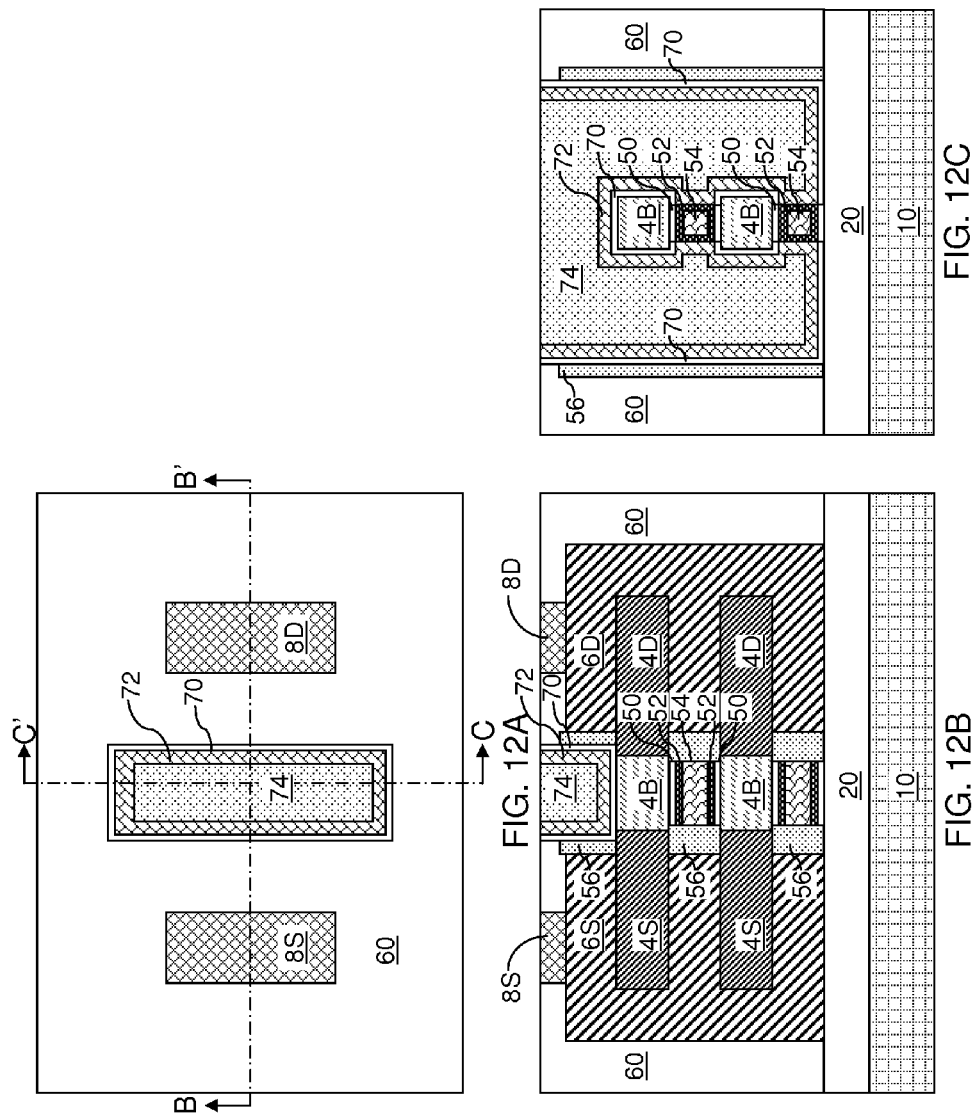

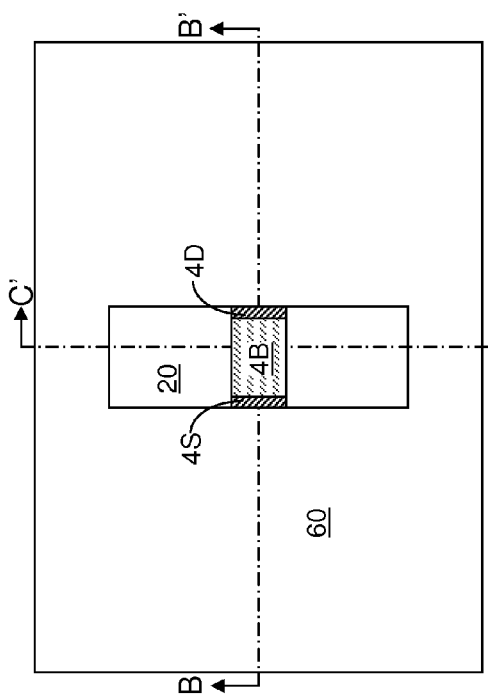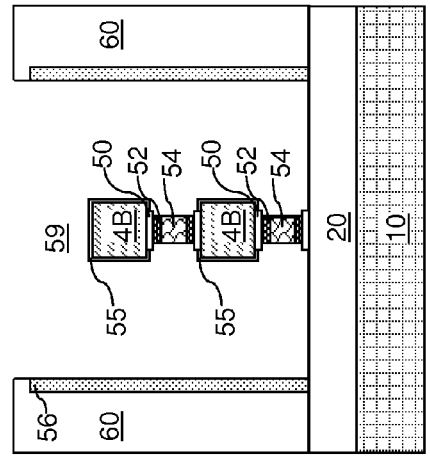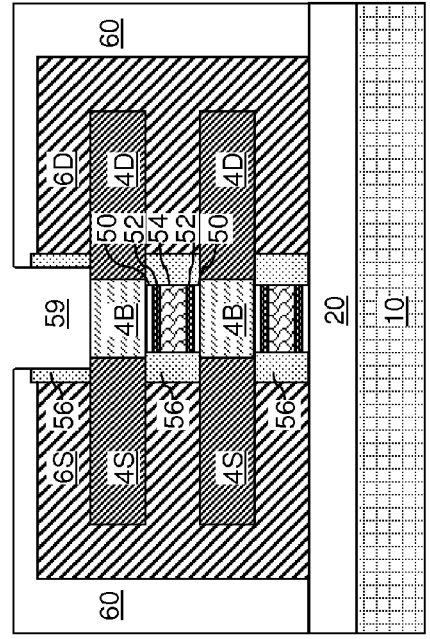
FIG. 13A
FIG. 13B
FIG. 13C

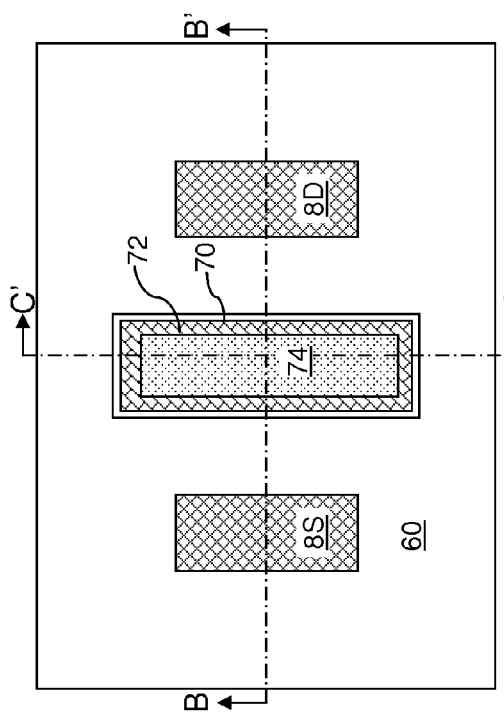
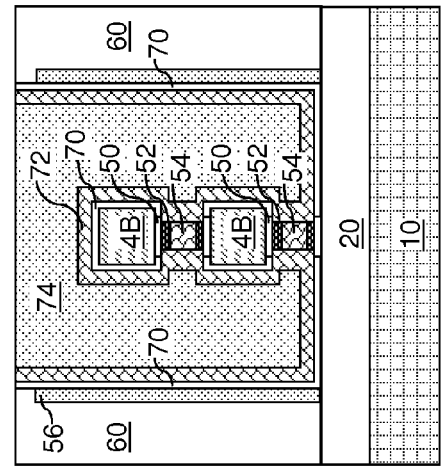
FIG. 14C
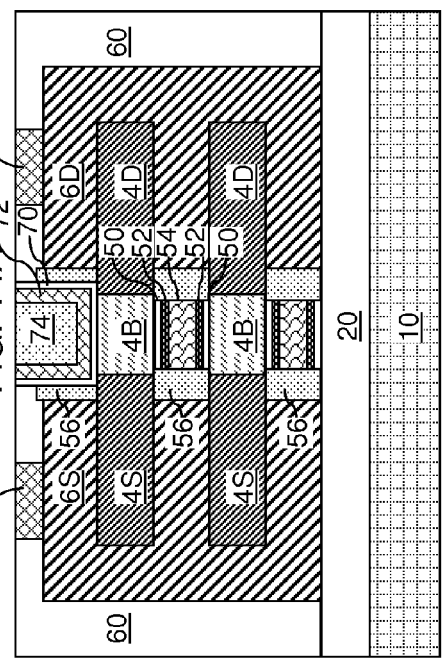
FIG. 14B

STRESSED NANOWIRE STACK FOR FIELD EFFECT TRANSISTOR

BACKGROUND

The present disclosure relates to a semiconductor structure, and particularly to a field effect transistor employing stressed nanowires and a method of manufacturing the same.

Stress in the body region of a field effect transistor can be advantageously employed to increase the mobility of minority charge carries, thereby providing a greater on-current. While a body region formed in a semiconductor fin or a planar semiconductor material portion laterally surrounded by a shallow trench isolation structure is structurally stable, attempts to generate a stress in suspended semiconductor nanowires typically result in deformation of the semiconductor nanowires. The deformation of the semiconductor nanowires can occur in the form of bending, or even buckling, of the semiconductor nanowires, and result in relief of the stress from the semiconductor nanowire. Thus, a method of retaining mechanical stress in suspended semiconductor nanowires is desired in order to provide a high performance field effect transistor employing suspended semiconductor nanowires.

SUMMARY

After patterning an alternating stack of first semiconductor material portions and second semiconductor material portions, a disposable gate structure is formed over the alternating stack. The second semiconductor material portions are removed selective to the first semiconductor material portions to form suspended semiconductor nanowires that are mechanically supported by the disposable gate structure. Isolated gate structures are formed in regions underlying the disposable gate structure by deposition and recessing of a first gate dielectric layer and a first gate conductor layer. After formation of a gate spacer, source regions, and drain regions, raised source and drain regions are formed on the source regions and the drain regions by selective deposition of a semiconductor material. A planarization dielectric layer is formed, and the disposable gate structure is replaced with a replacement gate structure by deposition and patterning of a second gate dielectric layer and a second gate conductor layer. Distortion of the suspended semiconductor nanowires is prevented by the disposable gate structure and the isolated gate structures during formation of the field effect transistor.

According to an aspect of the present disclosure, a semiconductor structure includes a first semiconductor nanowire overlying a substrate, a second semiconductor nanowire overlying the first semiconductor nanowire and vertically spaced from the first semiconductor nanowire, and a gate structure surrounding the first and second semiconductor nanowires. The gate structure includes a first gate dielectric contacting a bottom surface of the second semiconductor nanowire, and a second gate dielectric contacting a top surface and sidewall surfaces of the second semiconductor nanowire. The first gate dielectric and the second gate dielectric differ from each other by at least one of composition and thickness.

According to another aspect of the present disclosure, a method of forming a semiconductor structure is provided. An alternating stack of disposable material portions and semiconductor material portions is formed on a substrate. Each of the semiconductor material portions including a semiconductor nanowire. A disposable gate structure is formed, which straddles, and contacts sidewalls of, the alternating stack. The disposable material portions are removed selective to the semiconductor material portions and the disposable gate structure. A first gate structure is formed between each vertically neighboring pair among the semiconductor material portions. The first gate structure includes a first gate dielectric and a first gate electrode. A planarization dielectric layer is formed around the disposable gate structure. A gate cavity is formed by removing the disposable gate structure selective to the planarization dielectric layer. A second gate structure is formed within the gate cavity. The second gate structure includes a second gate dielectric and a second gate electrode.

BRIEF DESCRIPTION OF SEVERAL VIEWS OF THE DRAWINGS

FIG. 2A is a top-down view of the exemplary semiconductor structure after formation of a vertical stack of disposable material portions and semiconductor material portions according to an embodiment of the present disclosure.

FIG. 2B is a vertical cross-sectional view of the exemplary semiconductor structure along the vertical plane B-B' of FIG. 2A.

FIG. 2C is a vertical cross-sectional view of the exemplary semiconductor structure along the vertical plane C-C' of FIG. 2A.

FIG. 3A is a top-down view of the exemplary semiconductor structure after formation of a disposable gate structure according to an embodiment of the present disclosure.

FIG. 3B is a vertical cross-sectional view of the exemplary semiconductor structure along the vertical plane B-B' of FIG. 3A.

FIG. 3C is a vertical cross-sectional view of the exemplary semiconductor structure along the vertical plane C-C' of FIG. 3A.

FIG. 5A is a top-down view of the exemplary semiconductor structure after formation of first gate dielectrics, first metallic gate electrode portions, and first semiconductor gate electrode portions according to an embodiment of the present disclosure.

FIG. 5B is a vertical cross-sectional view of the exemplary semiconductor structure along the vertical plane B-B' of FIG. 5A.

FIG. 5C is a vertical cross-sectional view of the exemplary semiconductor structure along the vertical plane C-C' of FIG. 5A.

FIG. 5D is a vertical cross-sectional view of the exemplary semiconductor structure along the vertical plane D-D' of FIG. 5A.

FIG. 6A is a top-down view of the exemplary semiconductor structure after laterally recessing the first gate dielectrics, the first metallic gate electrode portions, and the first semiconductor gate electrode portions according to an embodiment of the present disclosure.

FIG. 6B is a vertical cross-sectional view of the exemplary semiconductor structure along the vertical plane B-B' of FIG. 6A.

FIG. 6C is a vertical cross-sectional view of the exemplary semiconductor structure along the vertical plane C-C' of FIG. 6A.

FIG. 6D is a vertical cross-sectional view of the exemplary semiconductor structure along the vertical plane D-D' of FIG. 6A.

FIG. 9A is a top-down view of the exemplary semiconductor structure after formation of a planarization dielectric layer and removal of the disposable gate structure according to an embodiment of the present disclosure.

FIG. 9B is a vertical cross-sectional view of the exemplary semiconductor structure along the vertical plane B-B' of FIG. 9A.

FIG. 9C is a vertical cross-sectional view of the exemplary semiconductor structure along the vertical plane C-C' of FIG. 9A.

FIG. 9D is a vertical cross-sectional view of the exemplary semiconductor structure along the vertical plane D-D' of FIG. 9A.

FIG. 10A is a top-down view of the exemplary semiconductor structure after lateral recessing of the first gate dielectrics according to an embodiment of the present disclosure.

FIG. 10B is a vertical cross-sectional view of the exemplary semiconductor structure along the vertical plane B-B' of FIG. 10A.

FIG. 10C is a vertical cross-sectional view of the exemplary semiconductor structure along the vertical plane C-C' of FIG. 10A.

FIG. 11A is a top-down view of the exemplary semiconductor structure after formation of a replacement gate structure including a second gate dielectric, a second metallic gate electrode portion, and a second semiconductor gate electrode portion according to a first embodiment of the present disclosure.

FIG. 11B is a vertical cross-sectional view of the exemplary semiconductor structure along the vertical plane B-B' of FIG. 11A.

FIG. 11C is a vertical cross-sectional view of the exemplary semiconductor structure along the vertical plane C-C' of FIG. 11A.

FIG. 12A is a top-down view of a first variation of the exemplary semiconductor structure after formation of a replacement gate structure including a second gate dielectric, a second metallic gate electrode portion, and a second semiconductor gate electrode portion according to a second embodiment of the present disclosure.

FIG. 12B is a vertical cross-sectional view of the first variation of the exemplary semiconductor structure along the vertical plane B-B' of FIG. 12A.

FIG. 12C is a vertical cross-sectional view of the first variation of the exemplary semiconductor structure along the vertical plane C-C' of FIG. 12A.

FIG. 13A is a top-down view of a second variation of the exemplary semiconductor structure after lateral removal of first metallic gate electrode portions according to an embodiment of the present disclosure.

FIG. 13B is a vertical cross-sectional view of the second variation of the exemplary semiconductor structure along the vertical plane B-B' of FIG. 13A.

FIG. 13C is a vertical cross-sectional view of the second variation of the exemplary semiconductor structure along the vertical plane C-C' of FIG. 13A.

FIG. 14A is a top-down view of the second variation of the exemplary semiconductor structure after formation of a replacement gate structure including a second gate dielectric, a second metallic gate electrode portion, and a second semiconductor gate electrode portion according to a third embodiment of the present disclosure.

FIG. 14B is a vertical cross-sectional view of the second variation of the exemplary semiconductor structure along the vertical plane B-B' of FIG. 14A.

FIG. 14C is a vertical cross-sectional view of the second variation of the exemplary semiconductor structure along the vertical plane B-B' of FIG. 14C.

DETAILED DESCRIPTION

Figure 1A:
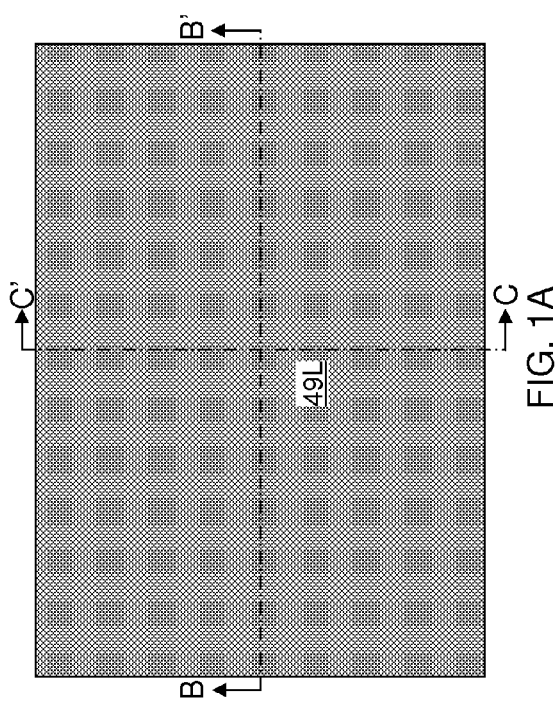
FIG. 1A is a top-down view of an exemplary semiconductor structure after formation of a vertical stack of a disposable material layer and a semiconductor material layer and formation of a cap material layer according to an embodiment of the present disclosure.

As stated above, the present disclosure relates to a field effect transistor employing stressed nanowires and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Figure 1C:
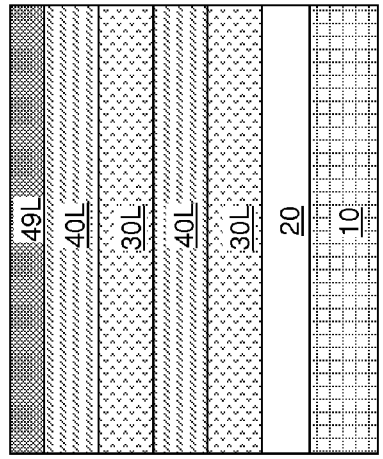
FIG. 1C is a vertical cross-sectional view of the exemplary semiconductor structure along the vertical plane C-C' of FIG. 1A.
Figure 1B:
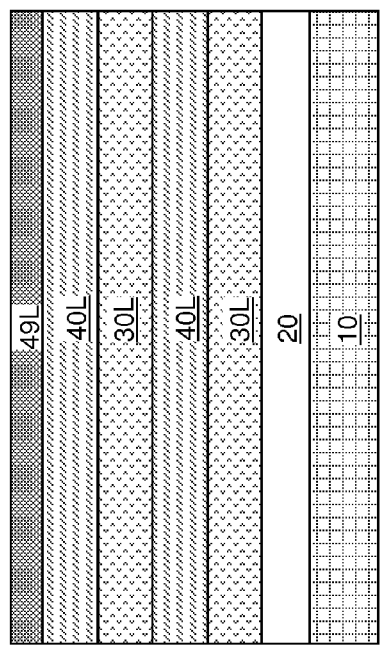
FIG. 1B is a vertical cross-sectional view of the exemplary semiconductor structure along the vertical plane B-B' of FIG. 1A.

Referring to FIGS. 1A-1C, an exemplary semiconductor structure according to an embodiment of the present disclosure includes a handle substrate 10, an insulator layer 20, and an alternating stack of a disposable material and a semiconductor material. The handle substrate 10 can include a semiconductor material, an insulator material, a conductive material, or a combination thereof. The thickness of the handle substrate 10 can be from 50 microns to 2 mm, although lesser and greater thicknesses can also be employed. The handle substrate 10 provides mechanical support for the insulator layer 20 and the alternating stack.

The insulator layer 20 includes a dielectric material such as silicon oxide, silicon nitride, silicon oxynitride, or a combination thereof. The insulator layer 20 can have a thickness in a range from 5 nm to 500 nm, although lesser and greater thicknesses can also be employed. The insulator layer 10 can have a planar top surface.

The alternating stack includes at least one semiconductor material layer 40L and at least one disposable material layer 30L. In one embodiment, the alternating stack can include a plurality of semiconductor material layers 40L and a plurality of disposable material layers 30L. As used herein, a "semiconductor material" refers to a material having a conductivity in a range from $3.0 \times 10^{-4}$ Ohm-cm to $3.0 \times 10^{3}$ Ohm-cm, and includes an intrinsic semiconductor material, a p-doped semiconductor material, an n-doped semiconductor material, or a semiconductor material having different types of doping. In one embodiment, one of the semiconductor material layers 40L can be formed directly on the insulator layer 20. In another embodiment, one of the disposable material layers 30L can be formed directly on the insulator layer. The disposable material layers 30L include a disposable material that can be removed selective to the semiconductor material of the semiconductor material layers 40L.

Each of the at least one semiconductor material layers 40L and the disposable material layers 30 can be single crystalline. In one embodiment, the entirety of the alternating stack (30L, 40L) can be single crystalline. In one embodiment, the insulator layer 20 can be single crystalline, and the alternating stack (30L, 40L) can be formed on the insulator layer 20 by a series of epitaxial deposition processes. In another embodiment, the insulator layer 20 can be amorphous, polycrystalline, or single crystalline, and the first material layer of the alternating stack (30L, 40L) can be bonded to the insulator layer 20 employing a bonding process known in the art.

In one embodiment, the semiconductor material layers 40L includes a silicon-containing semiconductor material in which the atomic concentration of silicon is greater than 80%, and the disposable material layers 30 can include a germanium-containing semiconductor material in which the atomic concentration of germanium is greater than 80%. For example, the semiconductor material layers 40L can include single crystalline silicon or a single crystalline silicon-germanium alloy in which the atomic concentration of germanium is less than 20%.

In another embodiment, the semiconductor material layers 40L includes a first single crystalline compound semiconductor material, and the disposable material layers 30L includes a second single crystalline compound semiconductor material that can be removed selective to the first single crystalline compound semiconductor material. For example, the semiconductor material layers 40L can include $In_xGa_{1-x}As$, GaAs or InP, and the disposable material layers 30L can include GaP or GaN.

In one embodiment, each of the disposable material layers 30L can be deposited as a single crystalline material layer in epitaxial alignment with an underlying material layer. In one embodiment, each of the semiconductor material layers 40L can be deposited as a single crystalline semiconductor material layer in epitaxial alignment with an underlying material layer.

The thicknesses of the disposable material layers 30L and the semiconductor material layers 40L are selected such that the entirety of the epitaxial alignment of the disposable material layers 30L and the semiconductor material layers 40L can be maintained throughout the entirety of the alternating stack (30L, 40L). Thus, the thickness of each of the disposable material layers 30L and the semiconductor material layers 40L is less than the critical thickness, which is the thickness at which an epitaxial material begins to lose epitaxial registry with the underlying single crystalline layer by developing dislocations. For example, the thickness of each of the disposable material layers 30L and the semiconductor material layers 40L can be in a range from 3 nm to 60 nm, although lesser and greater thicknesses can also be employed.

The number of repetitions for a pair of a disposable material layer 30L and a semiconductor material layer 40L can be 2 or greater. In one embodiment, the number of repetitions for a pair of a disposable material layer 30L and a semiconductor material layer 40L can be in a range from, and including, 2 to, and including, 100. The alternating stack (30L, 40L) may begin, at the bottom, with a semiconductor material layer 40L or with a disposable material layer 30L. Additionally, the alternating stack may terminate, at the top, with a semiconductor material layer 40L or with a disposable material layer 30L.

Optionally, a cap material layer 49L can be formed on top of the alternating stack (30L, 40L). The cap material layer 49L can include a dielectric material such as silicon nitride, silicon oxide, or a dielectric metal oxide, and can be formed by chemical vapor deposition (CVD). The thickness of the cap material layer 49L can be in a range from 3 nm to 60 nm, although lesser and greater thicknesses can also be employed.

Referring to FIGS. 2A-2C, the cap material layer 49L and the alternating stack (30L, 40L) of the semiconductor material layers 40L and the disposable material layers 30L are patterned to form a cap material portion 49 and a vertical stack (30, 40) of disposable material portions 30 and semiconductor material portions 40. For example, a photoresist layer (not shown) can be applied over the cap material layer 49L and lithographically patterned to cover a contiguous area. The shape of the contiguous area covered by the patterned photoresist layer can be selected to include an elongated region having a same width and two end portions having a greater width than the elongated region. The pattern in the photoresist layer can be transferred through the cap material layer 49L and the alternating stack (30L, 40L) of the semiconductor material layers 40L and the disposable material layers 30L by an anisotropic etch. A remaining portion of the cap material layer 49L is the cap material portion 49, and the remaining portions of the alternating stack (30L, 40L) of the semiconductor material layers 40L and the disposable material layers 30L constitute the vertical stack (30, 40) of the disposable material portions 30 and the semiconductor material portions 40.

In one embodiment, each of the disposable material portions 30 and the semiconductor material portions 40 can be "H-shaped" such that the elongated portion has a uniform width in a range from 10 nm to 100 nm. The disposable material portions 30 and the semiconductor material portions 40 can have sidewalls that are vertically coincident among one another. As used herein, surfaces are "vertically coincident" if the surfaces are located within a same vertical plane. In one embodiment, disposable material portions 30 and the semiconductor material portions 40 can have a same horizontal cross-sectional shape. In one embodiment, the portion corresponding to a horizontal line segment in the letter "H" in a "H-shaped" semiconductor material portion can be a semiconductor nanowire. As used herein, a "semiconductor nanowire" refers to a semiconductor material portion having a uniform width in a range from 1 nm to 100 nm.

In one embodiment, the disposable material portions 30 and the semiconductor material portions 40 can be single crystalline and epitaxially aligned among one another. Further, the disposable material portions 30 and the semiconductor material portions 40 can have different lattice constants. In this case, the disposable material portions 30 and the semiconductor material portions 40 can be in opposite types of stress along horizontal directions. In one embodiment, the semiconductor material portions 40 can be in a compressive stress along horizontal directions and the disposable material portions 30 can be in a tensile stress along horizontal directions. In another embodiment, the semiconductor material portions 40 can be in a tensile stress along horizontal directions and the disposable material portions 30 can be in a compressive stress along the horizontal directions.

Each semiconductor nanowire in the semiconductor material portions 40 can be under a stress along a lengthwise direction, i.e., the direction along which the semiconductor nanowire extends. The stress can be a compressive stress or a tensile stress.

The cap material layer 49L and the cap material portion 49 can be optional, i.e., may be present or not present. If present, the cap material portion 49 may be employed as a hard mask during the patterning of the vertical stack (30, 40) of the disposable material portions 30 and the semiconductor material portions 40. Further, the cap material portion 49 can be removed once the vertical stack (30, 40) of the disposable material portions 30 and the semiconductor material portions 40 is formed, for example, by a wet etch that removes the material of the cap material portion 49 selective to the insulator layer 20 and the vertical stack (30, 40) of the disposable material portions 30 and the semiconductor material portions 40.

Referring to FIGS. 3A-3C, a disposable gate structure 51 can be formed over, and across, the elongated portions of the cap material portion 49 and the vertical stack (30, 40) of the disposable material portions 30 and the semiconductor material portions 40. In one embodiment, the disposable gate structure 51 includes a dielectric material that is different from the dielectric material of the insulator layer 20. For example, the disposable gate structure 51 can include amorphous carbon, diamond-like carbon (DLC), a dielectric metal oxide, silicon nitride, or an organosilicate glass.

The disposable gate structure 51 can be formed by deposition and patterning of a dielectric material layer. The patterning of the dielectric material layer can be performed by a combination of lithographic methods and an anisotropic etch. In one embodiment, the width of the disposable gate structure 51 can be greater than the width of the various portions of the vertical stack (30, 40) of the disposable material portions 30 and the semiconductor material portions 40.

The disposable gate structure 51 straddles, and contacts sidewalls of, the vertical stack (30, 40) of the disposable material portions 30 and the semiconductor material portions 40 while each of the semiconductor nanowires in the semiconductor material portions 40 is under a stress along the lengthwise direction. Thus, the interface between the semiconductor nanowires and the disposable material structure 51 is formed in a state in which each of the semiconductor nanowires in the semiconductor material portions 40 is under a horizontal stress along the lengthwise direction.

Figure 4A:
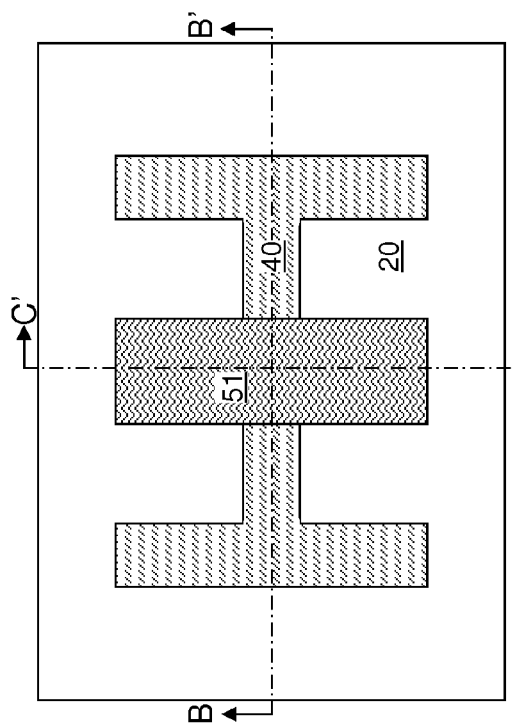
FIG. 4A is a top-down view of the exemplary semiconductor structure after removal of disposable material portions according to an embodiment of the present disclosure.
Figure 4C:
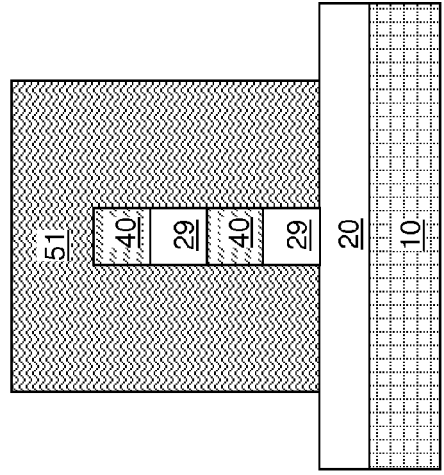
FIG. 4C is a vertical cross-sectional view of the exemplary semiconductor structure along the vertical plane C-C' of FIG. 4A.
Figure 4B:
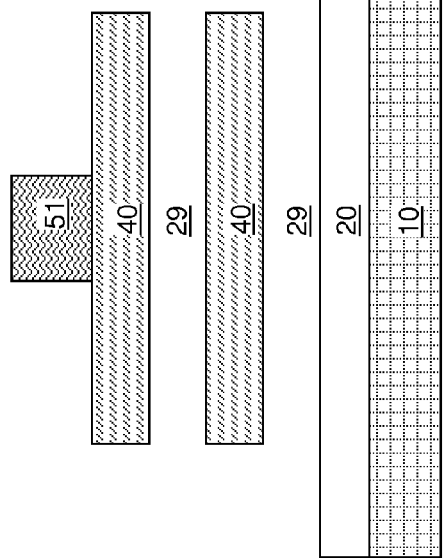
FIG. 4B is a vertical cross-sectional view of the exemplary semiconductor structure along the vertical plane B-B' of FIG. 4A.
Figure 7A:
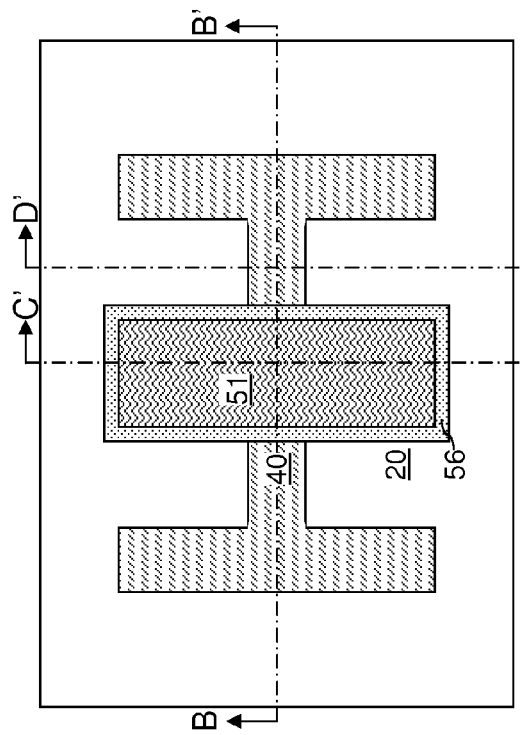
FIG. 7A is a top-down view of the exemplary semiconductor structure after formation of a gate spacer according to an embodiment of the present disclosure.
Figure 7D:
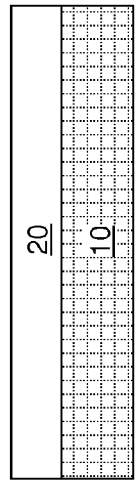
FIG. 7D is a vertical cross-sectional view of the exemplary semiconductor structure along the vertical plane D-D' of FIG. 7A.
Figure 7C:
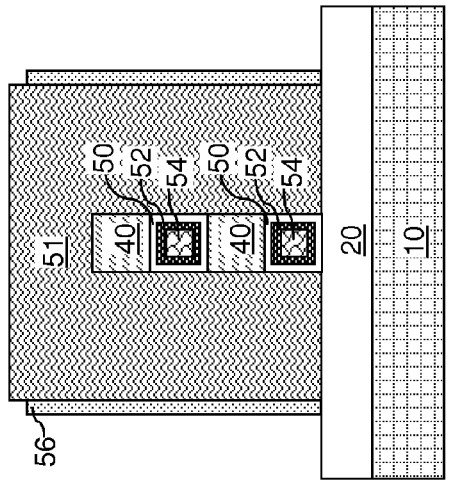
FIG. 7C is a vertical cross-sectional view of the exemplary semiconductor structure along the vertical plane C-C' of FIG. 7A.
Figure 7B:
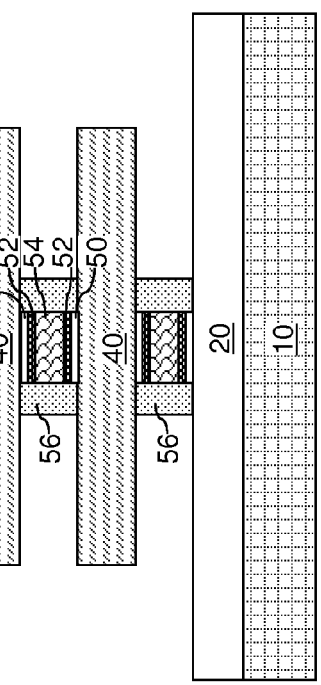
FIG. 7B is a vertical cross-sectional view of the exemplary semiconductor structure along the vertical plane B-B' of FIG. 7A.
Figure 8A:
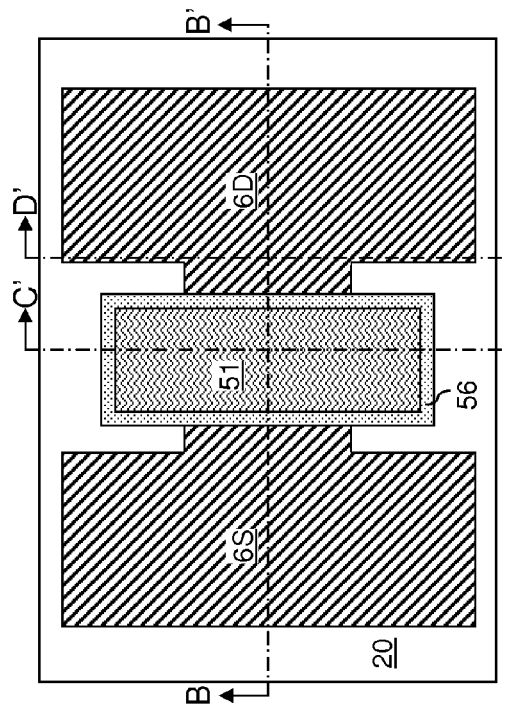
FIG. 8A is a top-down view of the exemplary semiconductor structure after formation of raised source and drain regions according to an embodiment of the present disclosure.
Figure 8D:
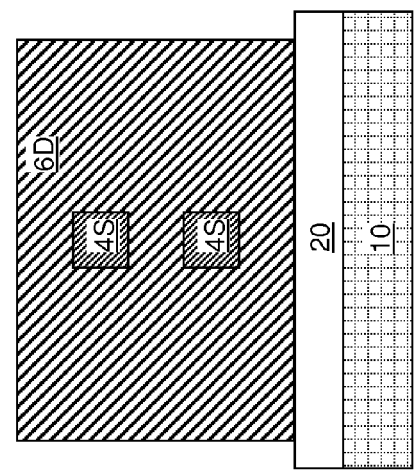
FIG. 8D is a vertical cross-sectional view of the exemplary semiconductor structure along the vertical plane D-D' of FIG. 8A.
Figure 8B:
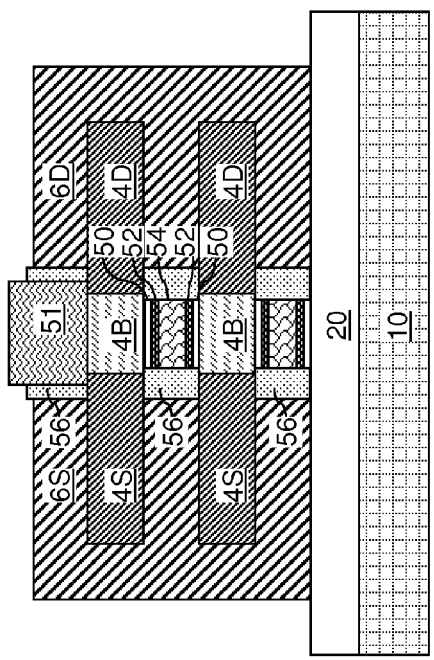
FIG. 8B is a vertical cross-sectional view of the exemplary semiconductor structure along the vertical plane B-B' of FIG. 8A.
Figure 8C:
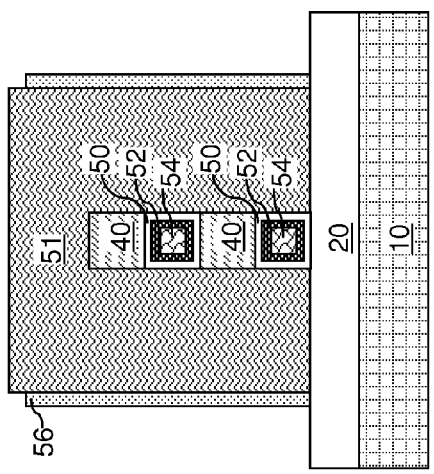
FIG. 8C is a vertical cross-sectional view of the exemplary semiconductor structure along the vertical plane C-C' of FIG. 8A.

Referring to FIGS. 4A-4C, the disposable material portions 30 are removed selective to the semiconductor material portions 40, the disposable gate structure 51, and the insulator layer 20. The disposable material portions 30 can be removed, for example, by an isotropic etch such as a wet etch. For example, if the disposable material portions 30 include a germanium-containing material in which the atomic concentration of germanium is greater than 80% and if the semiconductor material portions 40 include a silicon-containing semiconductor material in which the atomic concentration of silicon is greater than 80%, the disposable material portions 30 can be removed by a wet etch including hydrogen peroxide and hydrofluoric acid. If the disposable material portions 30 and the semiconductor material portions 40 include different compound semiconductor material, a wet etch chemistry that etches the compound semiconductor material of the disposable material portions 30 selective to the compound semiconductor material of the semiconductor material portions 40 can be employed to remove the disposable material portions 30. Wet etch chemistries that etch a compound semiconductor material selective to another compound semiconductor material are known in the art.

The removal of the disposable material portions 30 selective to the semiconductor material portions 40 and the disposable gate structure 51 can be performed while the disposable gate structure 51 prevents relief of the stress in the semiconductor nanowires in the semiconductor material portions 40. Specifically, physical contact between the vertical sidewalls of the disposable gate structure 51 and the semiconductor material portions 40 prevents relief of the stress in the semiconductor nanowires of the semiconductor material portions 40 by clamping the lattice constant of the semiconductor material of the semiconductor nanowires to a preexisting value, i.e., the strained value as provided by the disposable material portions 30 prior to removal. Lateral cavities 29 are formed between each neighboring pair of semiconductor material portions 40 and, if the bottommost semiconductor material portion 40 is vertically spaced from the top surface of the insulator layer, between the bottommost semiconductor material portion 40 and the top surface of the insulator layer 20.

Referring to FIGS. 5A-5D, a first gate dielectric layer, a first metallic material layer, and optionally a first doped semiconductor material layer are sequentially deposited on the surfaces of the semiconductor material portions 40 and the disposable gate structure 51. The first gate dielectric layer can include a dielectric metal oxide having a dielectric constant greater than 8.0, which is known in the art as a "high-k gate dielectric material." The first gate dielectric layer can be deposited, for example, by atomic layer deposition (ALD). The thickness of the first gate dielectric layer can be in a range from 1 nm to 3 nm, although lesser and greater thicknesses can also be employed. The first metallic material layer includes a conductive metallic material such as a metallic nitride and/or a metallic carbide. The first metallic material layer can be deposited, for example, by chemical vapor deposition or atomic layer deposition. The first doped semiconductor material layer, if present, can be deposited by chemical vapor deposition.

In one embodiment, the thickness of the first metallic material layer is selected such that the first metallic layer does not completely fill the volumes of the lateral cavities 29. In this case, the first doped semiconductor material layer can fill the remaining volumes of the lateral cavities 29. In another embodiment, the first doped semiconductor material layer can be omitted, and the first metallic layer can fill the lateral cavities 29.

The first metallic material layer and the first doped semiconductor material layer, if present, are collectively referred to as a first gate conductor layer. Thus, the first gate dielectric layer is formed on surfaces of the semiconductor material portions 40, the first gate conductor layer is formed on the first gate dielectric layer. The first gate conductor layer and the first gate dielectric layer are anisotropically etched employing a combination of the disposable gate structure 51 and the semiconductor material portions 50 as an etch mask.

Subsequently, the portions of the optional first doped semiconductor material layer, the first metallic material layer, and the first gate dielectric layer that do not underlie at least one semiconductor material portion 40 can be removed by an anisotropic etch that employs the disposable gate structure 51 and the semiconductor material portions 40 as etch masks. The anisotropic etch can be selective to the semiconductor material of the semiconductor material portions 40. The anisotropic etch may also be selective to the material of the disposable gate structure 51, or the material of the disposable gate structure 51 may be partially etched during the anisotropic etch provided that a portion of the disposable gate structure 51 remains over the topmost semiconductor material portion 40 after the anisotropic etch. The anisotropic etch can include multiple steps for etching the semiconductor material of the first doped semiconductor material layer, the metallic material of the first metallic material layer, and/or the first gate dielectric layer. Anisotropic etch chemistries known in the art can be employed. In addition, an isotropic etch chemistry may optionally be employed to remove the portions of the first gate dielectric layer from sidewalls of the semiconductor material portions 40 and the top surface of the topmost semiconductor material portion 40.

Remaining portions of the first gate dielectric layer constitute first gate dielectrics 50, remaining portions of the first metallic material layer constitute first metallic gate electrode portions 52, and remaining portions of the first doped semiconductor material layer constitute first semiconductor gate electrode portions 54. Each first gate dielectric 50 contacts a bottom surface of semiconductor material portion 40 and a top surface of another semiconductor material portion 40, or a bottom surface of semiconductor material portion 40 and a top surface of the insulator layer 20. Further, each first gate dielectric 50 contacts sidewall surfaces of the disposable gate structure 51. Each first metallic gate electrode portion 52 contacts, and is laterally surrounded by, a first gate dielectric 50. Each first semiconductor gate electrode portion 54, if present, contacts, and is laterally surrounded by, a first metallic gate electrode portion 52.

In one embodiment, outer sidewalls of the first gate dielectrics 50, outer sidewalls of the first metallic gate electrode portions 52, and outer sidewalls of the first semiconductor gate electrode portions 54 can be vertically coincident among one another and with the sidewalls of the semiconductor material portions 40.

Referring to FIGS. 6A-6D, the first semiconductor gate electrode portions 54, the first metallic gate electrode portions 52, and the first gate dielectrics 50 are laterally etched by isotropic etch processes selective to the semiconductor material portions 50 and the disposable gate structure 51. The isotropic etch processes can include wet etch processes. In one embodiment, a series of wet etch processes can be employed to laterally recess each of the first semiconductor gate electrode portions 54, the first metallic gate electrode portions 52, and the first gate dielectrics 50.

Thus, remaining portions of the first gate conductor layer and the first gate dielectric layer are laterally etched between vertically neighboring pair among the semiconductor material portions by the isotropic etch processes. Each adjoining set of a first metallic gate electrode 52 and a first semiconductor gate electrode 54 constitutes a first gate electrode (52, 54). The first gate electrode (52, 54) and the first gate dielectric 50 collectively constitute a first gate structure (50, 52, 54). Within each first gate structure (50, 52, 54), a first gate dielectric 50 surrounds, and encloses, a first gate electrode (52, 54).

The duration of the isotropic etch processes can be selected such that all portions of the first gate electrodes (52, 54) and the first gate dielectrics 50 that do not underlie the disposable gate structure 51 are etched. Thus, all remaining portions of the first gate electrodes (52, 54) and the first gate dielectrics 50 underlie the disposable gate structure 51. The physically exposed sidewall surfaces of the first gate electrodes (52, 54) and the first gate dielectrics 50, i.e., the surfaces of the first gate electrodes (52, 54) and the first gate dielectrics 50 that are not in physical contact with another element, can have a curvature caused by the isotropic etch processes, and can be laterally recessed inward with respect to the vertical planes including the sidewall surfaces of the disposable gate structure 51 that are perpendicular to the lengthwise direction of the semiconductor nanowires within the semiconductor material portions 40.

Referring to FIGS. 7A-7D, a gate spacer 56 can be formed around the disposable gate structure 51 and on the first gate electrode (52, 54). Specifically, the gate spacer 56 can be formed by depositing a conformal dielectric material layer on the semiconductor material portions 40 after formation of the first gate structure (50, 52, 54), anisotropically etching the conformal dielectric material layer, and then isotropically etching remaining portions of the conformal dielectric material layer. The conformal dielectric material layer includes a dielectric material that is different from the material of the disposable gate structure 51. For example, the conformal dielectric material layer can include silicon nitride, silicon oxide, and/or dielectric metal oxide.

The thickness of the conformal dielectric material layer can be selected to be greater than half the width of the semiconductor nanowires within the semiconductor material portions 40, and can be greater than the width of the widest regions of the semiconductor material portions 40. In one embodiment, the thickness of the conformal dielectric material layer can be selected to be the sum of the half the width of the semiconductor nanowires within the semiconductor material portions 40 and the target thickness of the uppermost portion of the gate spacer 56 to be formed on the outer sidewalls of the disposable gate structure 51.

An anisotropic etch process is employed to anisotropically etch horizontal portions of the conformal dielectric material layer. Subsequently, remaining portions of the deposited conformal dielectric material layer between neighboring pairs of semiconductor material portions 40 or between the bottommost semiconductor material portion 40 and the insulator layer 20 can be laterally recessed by an isotropic etch process. Concurrently, the portions of the deposited conformal dielectric material layer that laterally surround the disposable gate structure 51 can be laterally thinned. At the end of the isotropic etch, the gate spacer 56 can be formed as a single contiguous structure laterally contacting the outer sidewalls of the disposable gate structure 51 and laterally contacting each first gate structure (50, 52, 54).

Referring to FIGS. 8A-8D, source regions 4S and drain regions 4D can be formed by introduction of electrical dopants, which can be p-type dopants or n-type dopants, into physically exposed portions of the semiconductor material portions 40. The introduction of the electrical dopants can be performed by ion implantation, plasma doping, gas phase doping, or outdiffusion from a disposable doped silicate glass layer. In one embodiment, the combination of the disposable gate structure 51 and the gate spacer 56 can be employed as masking structures during introduction of the electrical dopants. Alternately or additionally, electrical dopants may also be introduced prior to formation of the gate spacer 56. Regions of the semiconductor material portions 40 into which the electrical dopants are not introduced constitute body regions 4B. A p-n junction can be formed between each body region 4B and the source and drain regions (4S, 4B) within each semiconductor material portion (4S 4D, 4B).

Optionally, a selective epitaxy process can be performed to form a raised source region 6S and a raised drain region 6D.

During the selective epitaxy process, a semiconductor material is deposited only on semiconductor surfaces, and does not nucleate on dielectric surfaces. The raised source region 6S is formed on the source regions 4S, and the raised drain region 6D is formed on the drain regions 6D. The raised source region 6S and the raised drain region 6D can be formed with in-situ doping of the electrical dopants, or by deposition of an intrinsic semiconductor material and subsequent introduction of electrical dopants by ion implantation, plasma doping, gas phase doping, or outdiffusion from a disposable doped silicate glass layer. In one embodiment, additional electrical dopants can be introduced into the source regions 4S and the drain regions 4D by outdiffusion of the electrical dopants from the raised source region 6S and the raised drain region 6D during an anneal.

Referring to FIGS. 9A-9D, a planarization dielectric layer 60 is deposited over the raised source region 6S and the raised drain region 6D and around the disposable gate structure 51. The planarization dielectric layer 60 includes a dielectric material different from the material of the disposable gate structure 51. For example, the planarization dielectric layer 60 can include undoped silicate glass, doped silicate glass, organosilicate glass, and/or silicon nitride. In one embodiment, the planarization dielectric layer 60 includes organosilicate glass. The top surface of the planarization dielectric layer 60 can be planarized employing the top surface of the disposable gate structure 51 as a stopping surface. Upon planarization, the top surface of the planarization dielectric layer 60 can be planar, i.e., two-dimensional, and can be coplanar with the top surface of the disposable gate structure 51.

The disposable gate structure 51 can be subsequently removed selective to the planarization dielectric layer 60 by an etch process, which can be an isotropic etch or an anisotropic etch. For example, the disposable gate structure 51 can be removed selective to the planarization dielectric layer 60 by a wet etch process. A gate cavity 59 is formed in the volume from which the disposable gate structure 51 is removed. The outer sidewalls of the first gate dielectrics 50 and the sidewalls of the semiconductor material portions 40 are physically exposed inside the gate cavity 59.

The stress within the semiconductor material portions (4S, 4D, 4B) can be preserved during the removal of the disposable gate structure 51 due to the presence of the first gate structures (50, 52, 54), which constrain the volume changes within the semiconductor material portions (4S, 4D, 4B).

Referring to FIGS. 10A-10C, the first gate dielectrics 50 can be laterally recessed and removed. Specifically, the vertical portions of the first gate dielectrics 50 can be etched by an isotropic etch such as a wet etch. A wet etch chemistry for removing a dielectric metal oxide can be employed during the isotropic etch. The removal of the vertical portions of the first gate dielectrics 50 can be selective to the first metallic gate electrode portions 52. Sidewalls of the first metallic gate electrode portions 52 can be physically exposed after the isotropic etch process.

Referring to FIGS. 11A-11C, a replacement gate structure (70, 72, 74) is formed within the gate cavity 59 by deposition of a second gate dielectric layer, a second metallic material layer, and optionally, a second doped semiconductor material layer, and removal of the portions of the second gate dielectric layer, the second metallic material layer, and the second doped semiconductor material layer from above the top surface of the planarization dielectric layer 60, for example, by chemical mechanical planarization (CMP). The remaining portion of the second gate dielectric layer constitutes a second gate dielectric 70, the remaining portion of the second metallic material layer constitutes a second metallic gate electrode portion 72, and the remaining portion of the second doped semiconductor material layer constitutes a second semiconductor gate electrode portion 74. The second metallic gate electrode portion 72 and the second semiconductor gate electrode portion 74 collectively constitute a second gate electrode (72, 74).

The second gate dielectric 70 can include a dielectric metal oxide having a dielectric constant greater than 8.0. The thickness of the second gate dielectric 70 can be from 1 nm to 3 nm, although lesser and greater thicknesses can also be employed. In one embodiment, the second gate dielectric 70 can differ from the first gate dielectric 50 by at least one of composition and thickness. The second gate dielectric is formed directly on sidewalls of the first gate electrode (52, 54).

The exemplary semiconductor structure includes a first semiconductor nanowire, i.e., an elongated portion of a semiconductor material portion (4S, 4D, 4B) that is not the topmost semiconductor material portion (4S, 4D, 4B), overlying a substrate (10, 20), and a second semiconductor nanowire overlying the first semiconductor nanowire and vertically spaced from the first semiconductor nanowire, i.e., an elongated portion of another semiconductor material portion (4S, 4D, 4B) that is a vertically neighboring, and overlying, the first semiconductor nanowire. For example, the first semiconductor nanowire can be a center portion of the lower semiconductor material portion (4S, 4D, 4B) in FIG. 11B, and the second semiconductor nanowire can be a center portion of the upper semiconductor material portion (4S, 4D, 4B) in FIG. 11B.

The exemplary semiconductor structure further includes a gate structure (50, 52, 54, 70, 72, 74) surrounding the first and second semiconductor nanowires. The gate structure (50, 52, 54, 70, 72, 74) includes a first gate dielectric 50 contacting a bottom surface of the second semiconductor nanowire, and a second gate dielectric 70 contacting a top surface and sidewall surfaces of the second semiconductor nanowire. In one embodiment, the first gate dielectric 50 and the second gate dielectric 70 can differ from each other by at least one of composition and thickness.

The exemplary semiconductor structure can further include a first gate electrode (52, 54) underlying the first gate dielectric 50 and overlying the first semiconductor nanowire, and a second gate electrode (72, 74) contacting the second gate dielectric 70. In one embodiment, the second gate electrode (72, 74) and the first gate electrode (52, 54) can differ from each other by composition. Another first gate dielectric 50 can contact a bottom surface of the first gate electrode (52, 54) and a top surface of the first semiconductor nanowire. The second gate dielectric 70 can be in physical contact with sidewalls of the first gate electrode (52, 54).

Each first gate electrode (52, 54) can include a first metallic gate electrode portion 52 and a first semiconductor gate electrode portion 54. Each first metallic gate electrode portion 52 within a first gate electrode (52, 54) can be a single metallic gate electrode portion, and the first semiconductor gate electrode portion 54 can be laterally spaced from the second gate electrode (72, 74) by the single metallic gate electrode portion.

A portion of the gate spacer 56 can be located between the first and second semiconductor nanowires. The gate spacer 56 includes a sidewall that contacts the first gate dielectric 50, a horizontal surface contacting a bottom surface of the second semiconductor nanowire, and another horizontal surface contacting a top surface of the first semiconductor nanowire.

The first gate electrodes (52, 54) are not electrically shorted to the second gate electrode (72, 74), but are capacitively coupled to the second gate electrode (72, 74) through the second gate dielectric 70.

Referring to FIGS. 12A-12C, a first variation of the exemplary semiconductor structure can be derived from the exemplary semiconductor structure of FIGS. 10A-10C by employing a selective deposition process for formation of a second gate dielectric 70. Specifically, a deposition process for depositing a dielectric metal oxide selectively on semiconductor surfaces while suppressing deposition of the dielectric metal oxide on metallic surfaces is employed to form the second gate dielectric 70. Thus, the second gate dielectric 70 does not nucleate on the surfaces of the first metallic gate electrode portions 52, and is deposited on the physically exposed surfaces of the semiconductor material portions (4S, 4D, 4B). The second gate dielectric 70 may, or may not, be deposited on the surfaces of the insulator layer 20 and/or on the surfaces of the gate spacer 56.

Methods of selectively depositing a dielectric metal oxide material on semiconductor surfaces while suppressing nucleation on a metallic surface are known in the art. For example, S. K. Selvaraj et al, "Selective Atomic Layer Deposition of Zirconia on Copper Patterned Silicon Substrates Using Ethanol as Oxygen Source as well as Copper Reductant," J. Vacuum Science & Technology, A 32, 010601 (2014), and Q. Tiao et al., "On the Initial Growth of Atomic Layer Deposited TiO2 Films on Silicon and Copper Surfaces," Thin Solid Films 520 (2012) 6752-6756 disclose exemplary methods for depositing a dielectric metal oxide material on semiconductor surfaces while preventing nucleation of the dielectric metal oxide material on metallic surfaces.

Subsequently, the second gate electrode (72, 74) can be formed in the gate cavity 59 employing the processing steps FIGS. 11A-11C. The second gate electrode (72, 74) includes a second metallic gate electrode portion 72, and can optionally include a second semiconductor gate electrode portion 74. In the first variation of the exemplary semiconductor structure, the second gate electrode (72, 74) is deposited directly on the sidewalls of the first metallic gate electrode portions 52 of the first gate electrodes (52, 54). Thus, the second gate electrode (72, 74) can be in physical contact with the sidewalls of the first metallic gate electrode portions 52 of the first gate electrodes (52, 54), and can be electrically shorted to the first gate electrode (52, 54).

Referring to FIGS. 13A-13C, a second variation of the exemplary semiconductor structure can be derived from the exemplary semiconductor structure of FIGS. 10A-10C by forming sacrificial oxide layers 55 on the surfaces of the semiconductor material portions (4S, 4D, 4B) to prevent hydrogen termination in a subsequent process. The sacrificial oxide layers 55 can be formed as a chemical oxide layer as known in the art, or can be formed as a native oxide layer. The sacrificial oxide layers 55 include an oxide of the semiconductor material of the semiconductor material portions (4S, 4D, 4B). The thickness of the sacrificial oxide layers 55 can be in a range from 0.2 nm to 0.8 nm, although lesser and greater thicknesses can also be employed.

The vertical portions of the first metallic gate electrode portions 52 are then removed to physically expose the sidewalls of the first semiconductor gate electrode portions 54. The removal of the vertical portions of the first metallic gate electrode portions 52 can be performed, for example, by a wet etch that removes the metallic material of the first metallic gate electrode portions 52 selective to the semiconductor material of the first semiconductor gate electrode portions 54. The surfaces of the first semiconductor gate electrode portions 54 are treated with a chemical such as hydrofluoric acid to provide hydrogen termination, while the sacrificial oxide layers 55 prevent hydrogen termination of the surfaces of the semiconductor material portions (4S, 4D, 4B). The sacrificial oxide layers 55 may, or may not, be removed during the treatment of the surfaces of the first semiconductor gate electrode portions 54 to provide hydrogen termination.

Referring to FIGS. 14A-14C, a selective deposition process is employed for formation of a second gate dielectric 70. Specifically, a deposition process for depositing a dielectric metal oxide selectively on non-hydrogen-terminated semiconductor surfaces while suppressing deposition of the dielectric metal oxide on hydrogen-terminated semiconductor surfaces is employed to form the second gate dielectric 70. Thus, the second gate dielectric 70 does not nucleate, or poorly nucleates, on the surfaces of the first semiconductor gate electrode portions 54, and is deposited on the physically exposed surfaces of the semiconductor material portions (4S, 4D, 4B). The second gate dielectric 70 may, or may not, be deposited on the surfaces of the insulator layer 20 and/or on the surfaces of the gate spacer 56.

Methods of selectively depositing a dielectric metal oxide material on non-hydrogen-terminated semiconductor surfaces while suppressing nucleation on hydrogen-terminated semiconductor surfaces are known in the art. For example, M. M. Frank et al, "Hydrogen Barrier Layer Against Silicon Oxidation during Atomic Layer deposition of $Al_2O_3$ and $HfO_2$," J. Electrochemical Society, 154 (2) G44-G48 (2007); M. L. Green et al., "Nucleation and Growth of Atomic Layer Deposited $HfO_2$ Gate Dielectric Layers on Chemical Oxide (Si—O—H) and Thermal Oxide ($SiO_2$ or Si—O—N) Underlayers," J. Applied Physics, Vol. 92, No. 12, pp. 7168-7174 (2002); and "Enhanced Initial Growth of Atomic-Layer-Deposited metal Oxides on Hydrogen-Terminated Silicon," Applied Physics Letters Vol. 83, No. 4, pp. 740-742 (2003) disclose exemplary methods for depositing a dielectric metal oxide material on non-hydrogen-terminated semiconductor surfaces while preventing, or retarding, nucleation of the dielectric metal oxide material on hydrogen-terminated semiconductor surfaces.

Subsequently, the second gate electrode (72, 74) can be formed in the gate cavity 59 employing the processing steps FIGS. 11A-11C. The second gate electrode (72, 74) includes a second metallic gate electrode portion 72, and can optionally include a second semiconductor gate electrode portion 74. In the second variation of the exemplary semiconductor structure, the second gate electrode (72, 74) is deposited directly on the sidewalls of the first semiconductor gate electrode portions 54 of the first gate electrodes (52, 54). Thus, the second gate electrode (72, 74) can be in physical contact with the sidewalls of the first semiconductor gate electrode portions 54 of the first gate electrodes (52, 54), and can be electrically shorted to the first gate electrode (52, 54).

In the second variation of the first exemplary semiconductor structure, a pair of first metallic gate electrode portions 52 are present within each first gate electrode (52, 54). Within each first gate electrode (52, 54), the first semiconductor gate electrode portion 54 is in physical contact with two first metallic gate electrode portions 52. Each first gate electrode (52, 54) is in physical contact with the second gate electrode (72, 74).

The presence of the disposable gate structure 51 from the processing steps of FIGS. 3A-3C until the processing steps of FIGS. 8A-8D in combination with the presence of the first gate structures (50, 52, 54) from the processing steps of FIGS. 6A-6D to the processing steps of FIGS. 11A-11C, 12A-12C, or 14A-14C preserves the stress in the semiconductor nanowires in the semiconductor material portions. Thus, a field effect transistor including multiple vertically stacked semiconductor nanowires under a stress along the lengthwise direction can be provided according to the various embodiments of the present disclosure.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a first semiconductor nanowire overlying a substrate;
   a second semiconductor nanowire overlying said first semiconductor nanowire and vertically spaced from said first semiconductor nanowire; and
   a gate structure surrounding said first and second semiconductor nanowires, wherein said gate structure includes:
   a first gate dielectric contacting a bottom surface of said second semiconductor nanowire;
   a second gate dielectric contacting a top surface and sidewall surfaces of said second semiconductor nanowire; and
   a gate spacer including a sidewall that contacts said first gate dielectric, a horizontal surface contacting a bottom surface of said second semiconductor nanowire, and another horizontal surface contacting a top surface of said first semiconductor nanowire.

2. The semiconductor structure of claim 1, further comprising:
   a first gate electrode underlying said first gate dielectric and overlying said first semiconductor nanowire; and
   a second gate electrode contacting said second gate dielectric.

3. The semiconductor structure of claim 2, wherein said second gate electrode and said first gate electrode differ from each other by composition.

4. The semiconductor structure of claim 2, further comprising another first gate dielectric contacting a bottom surface of said first gate electrode and a top surface of said first semiconductor nanowire.

5. The semiconductor structure of claim 2, wherein said second gate dielectric is in physical contact with sidewalls of said first gate electrode.

6. The semiconductor structure of claim 2, wherein said second gate electrode is in physical contact with sidewalls of said first gate electrode.

7. The semiconductor structure of claim 6, wherein said first gate electrode comprises:
   at least one metallic gate electrode portion; and
   a semiconductor gate electrode portion.

8. The semiconductor structure of claim 7, wherein said at least one metallic gate electrode portion is a single metallic gate electrode portion, and said semiconductor gate electrode portion is laterally spaced from said second gate electrode by said single metallic gate electrode portion.

9. The semiconductor structure of claim 7, wherein said at least one metallic gate electrode portion is a pair of metallic gate electrode portions, and wherein said semiconductor gate electrode portion is in physical contact with said second gate electrode.

10. A semiconductor structure comprising:
    a first semiconductor nanowire overlying a substrate;
    a second semiconductor nanowire overlying said first semiconductor nanowire and vertically spaced from said first semiconductor nanowire; and
    a gate structure surrounding said first and second semiconductor nanowires, wherein said gate structure includes:
    a first gate dielectric contacting a bottom surface of said second semiconductor nanowire;
    a second gate dielectric contacting a top surface and sidewall surfaces of said second semiconductor nanowire
    a first gate electrode underlying said first gate dielectric and overlying said first semiconductor nanowire; and
    a second gate electrode contacting said second gate dielectric, wherein said second gate electrode is in physical contact with sidewalls of said first gate electrode and wherein said first gate electrode comprises at least one metallic gate electrode portion, and a semiconductor gate electrode portion.

11. The semiconductor structure of claim 10, wherein said second gate electrode and said first gate electrode differ from each other by composition.

12. The semiconductor structure of claim 10, further comprising another first gate dielectric contacting a bottom surface of said first gate electrode and a top surface of said first semiconductor nanowire.

13. The semiconductor structure of claim 10, wherein said at least one metallic gate electrode portion is a single metallic gate electrode portion, and said semiconductor gate electrode portion is laterally spaced from said second gate electrode by said single metallic gate electrode portion.

14. The semiconductor structure of claim 10, wherein said at least one metallic gate electrode portion is a pair of metallic gate electrode portions, and wherein said semiconductor gate electrode portion is in physical contact with said second gate electrode.

* * * * *